(12) United States Patent
Huang (10) Patent No.: US 8,458,872 B2
(45) Date of Patent: Jun. 11, 2013

(54) LOW-PRESSURE PROCESS APPARATUS

(75) Inventor: Ting-Hui Huang, Tao Yuan Shien (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 13/085,209

(22) Filed: Apr. 12, 2011

(65) Prior Publication Data

US 2011/0185588 A1    Aug. 4, 2011

Related U.S. Application Data

(62) Division of application No. 11/421,501, filed on Jun. 1, 2006, now Pat. No. 7,958,612.

(30) Foreign Application Priority Data

Dec. 28, 2005 (TW) ............................ 94146971 A (51) Int. Cl.
*B23B 3/16* (2006.01)
*B23B 7/04* (2006.01)

(52) U.S. Cl.
USPC ......... 29/42; 29/426.1; 156/345.51; 193/35 R (58) Field of Classification Search
USPC ......... 29/426.1, 284, 42; 156/345.51, 345.54, 156/345.55, 381, 382
See application file for complete search history.

(56) References Cited

U.S. PATENT DOCUMENTS

| 3,255,843 | A | * | 6/1966 | MacDonald ............... 181/291 |
| 3,641,681 | A | | 2/1972 | Brock |
| 3,843,916 | A | | 10/1974 | Trotel et al. |
| 4,341,592 | A | | 7/1982 | Shortes et al. |
| 4,714,511 | A | | 12/1987 | Nakao |
| 4,915,777 | A | | 4/1990 | Jucha et al. |
| 5,226,056 | A | | 7/1993 | Kikuchi et al. |
| 5,320,707 | A | | 6/1994 | Kanekiyo et al. |
| 5,328,540 | A | * | 7/1994 | Clayton et al. ............. 156/285 |
| 5,388,945 | A | | 2/1995 | Garric et al. |
| 6,092,578 | A | | 7/2000 | Machida et al. |
| 7,749,351 | B2 | | 7/2010 | Kataoka et al. |

FOREIGN PATENT DOCUMENTS

| JP | 07-335923 | 12/1995 |
| JP | 08-288371 | 11/1996 |
| JP | 2005-19967 | 1/2005 |
| JP | 2006-253517 | 9/2006 |

* cited by examiner

*Primary Examiner* — Peter DungBa Vo
*Assistant Examiner* — Jeffrey T Carley
(74) *Attorney, Agent, or Firm* — McClure, Qualey & Rodack, LLP (57) ABSTRACT

A low-pressure process apparatus for processing a substrate comprises a base, a stage, a housing and at least one first roller set. The stage is disposed on the base for supporting the substrate. The housing is detachably disposed on the base moving between a first position and a second position, wherein when the housing is in a first position, the housing and the base form a chamber to receive the stage. When the housing is detached, the first roller set contacts and supports the housing to facilitate movement thereof in a first horizontal direction.

7 Claims, 13 Drawing Sheets

500
LOW-PRESSURE PROCESS APPARATUS

CROSS REFERENCE TO RELATED APPLICATIONS

This present application is a divisional application of and claims priority from U.S. patent application Ser. No. 11/421,501, filed Jun. 1, 2006, now U.S. Pat. No. 7,958,612, the content of which is hereby incorporated by reference in its entirety.

BACKGROUND OF THE INVENTION

1. Field of the Invention

The invention relates to a low-pressure process apparatus, and in particular to a low-pressure process apparatus for drying photoresist.

2. Description of the Related Art

Figure 1A:
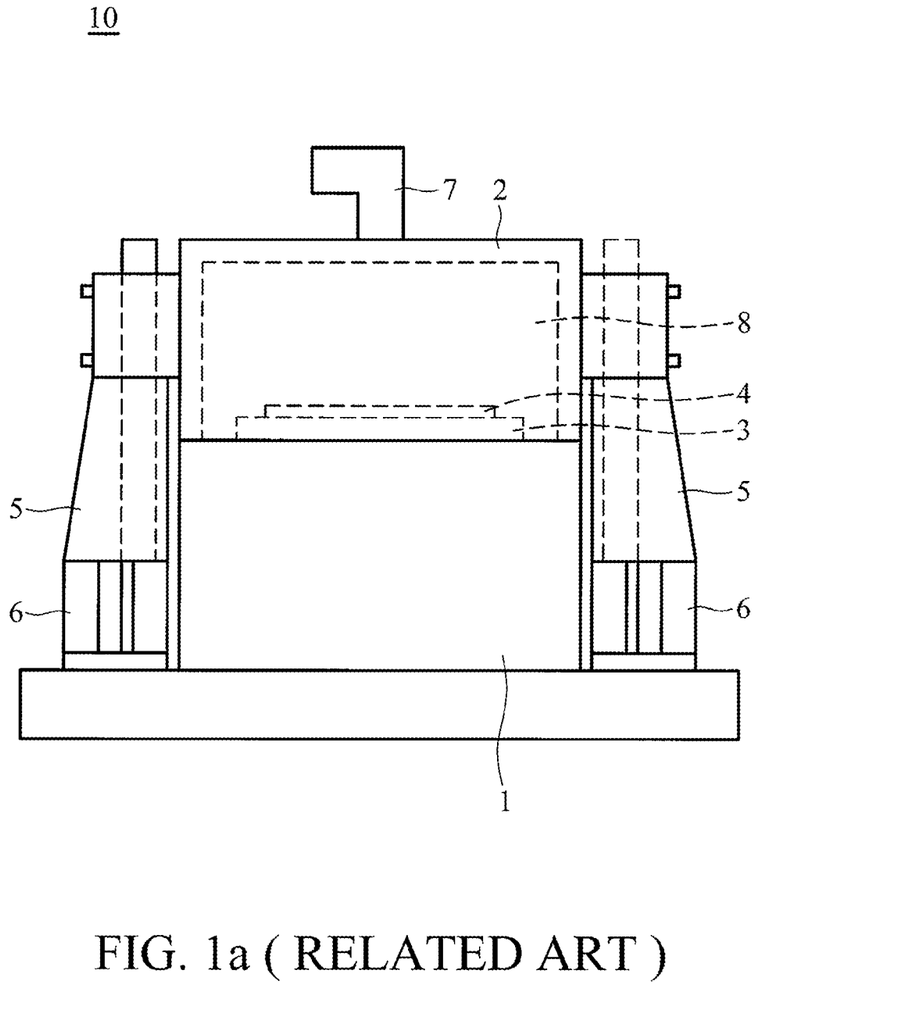
FIG. 1a shows a conventional low-pressure process apparatus.
Figure 1B:
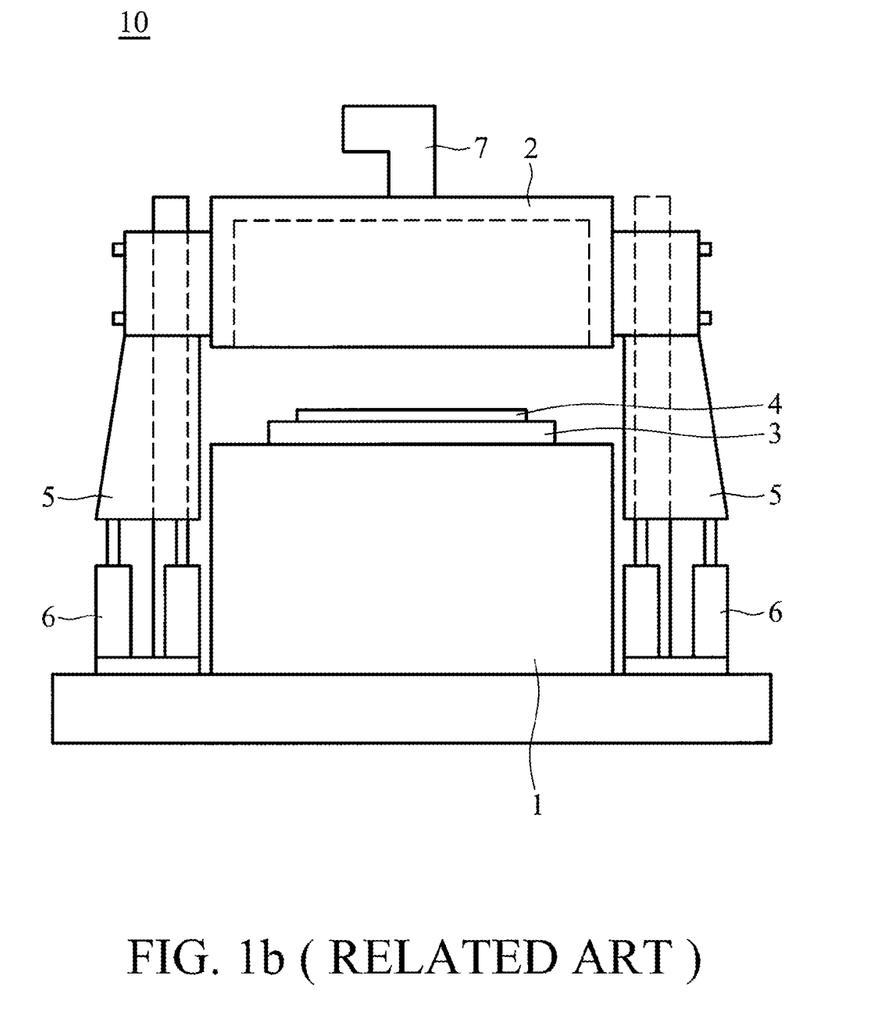
FIG. 1b shows the conventional low-pressure process apparatus raising a housing thereof.

FIG. 1a shows a conventional low-pressure process apparatus 10 comprising a base 1, a housing 2, a stage 3, supporting elements 5, actuating devices 6 and an exhaust pipe 7. The stage 3 is disposed on the base 1, supporting a substrate 4. The housing 2 and the base 1 form a chamber 8 receiving the stage 3 and the substrate 4. The exhaust pipe 7 and the supporting elements 5 are disposed on the base 2. The actuating devices 6 are disposed on the base 1. With reference to FIG. 1b, the actuating devices 6 push the supporting elements 5 and the housing 2, and separate the housing 2 from the base 1 allowing a robot (not shown) to access the substrate 4.

When the low-pressure process apparatus 10 dries a photoresist material (for example, resin), volatile chemical or particles are deposited on an inner wall of the housing of the exhaust pipe 7. Thus, the housing 2 and the exhaust pipe 7 require regular cleaning. Conventionally, the housing 2 and the exhaust pipe 7 are manually cleaned after the housing is elevated. The cleaning process is difficult and time consuming. Additionally, when the housing 2 and the exhaust pipe 7 are cleaned, the low-pressure process apparatus 10 is shut down affecting process yield.

BRIEF SUMMARY OF THE INVENTION

A detailed description is given in the following embodiments with reference to the accompanying drawings.

The invention provides low-pressure process apparatus for processing a substrate, comprising a base, a stage, a housing and at least one first roller set. The stage is disposed on the base, supporting the substrate. The housing is detachably disposed on the base and moves between a first position and a second position, wherein, when in a first position, the housing and the base form a chamber to receive the stage. When the housing is detached, the first roller set contacts and supports the housing to allow movement in a first horizontal direction.

The housing of the invention is detached and removed from the base to be cleaned. Thus, when the original housing (first housing) is cleaned, another housing (second housing) can be disposed on the base to continue the low-pressure process. Shutdown time of the low-pressure process apparatus is thus shortened, and yield and cost are conserved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
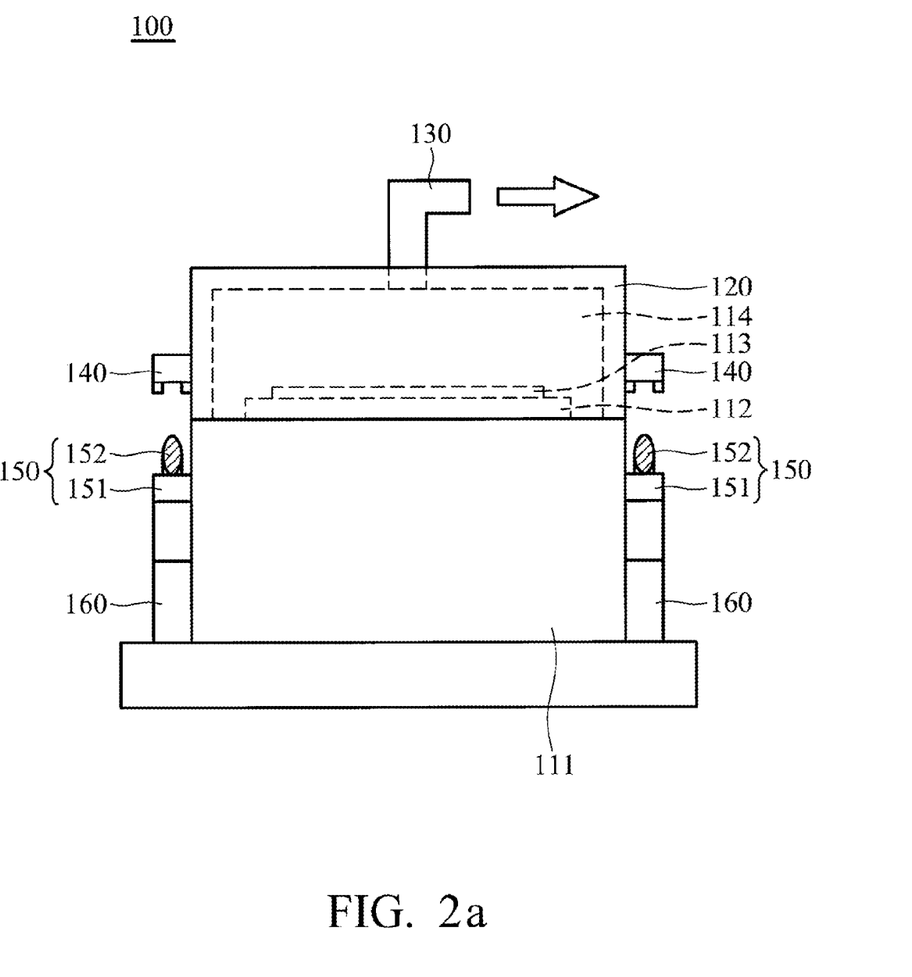
FIG. 2a is a front view of a low-pressure process apparatus of a first embodiment of the invention.

FIG. 2a is a front view of a low-pressure process apparatus 100 of a first embodiment of the invention, comprising a base 111, a housing 120, lead grooves 140, first roller sets 150 and air cylinders (actuating devices) 160. A stage 112 is disposed on the base 111 supporting a substrate 113. The housing 120 is disposed on the base 111, and forms a chamber 114 with the base 111. The stage 112 and the substrate 113 are received in the chamber 114. An exhaust pipe 130 is disposed on the housing 120 extending into the chamber 114 for exhausting air therefrom. The actuating devices 160 are disposed on the base 111. The first roller sets 150 are disposed on the actuating devices 160. The lead grooves are disposed on two sides of the housing 114 corresponding to the first roller sets 150.

Figure 2B:
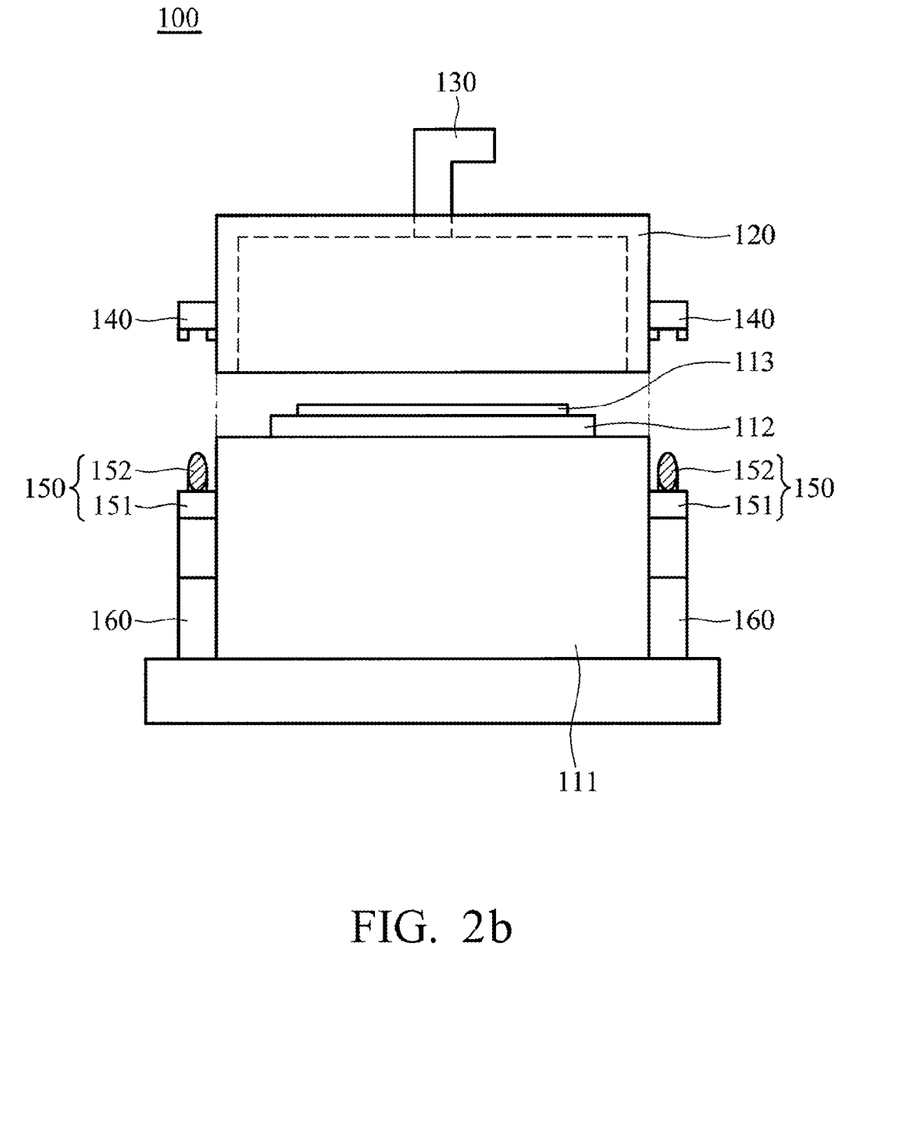
FIG. 2b is a front view of a low-pressure process apparatus of the invention when a housing thereof is in a second position.

With reference to FIG. 2b, the housing 120 is moveable between a first position (as shown in FIG. 2a) and a second position (as shown in FIG. 2b), wherein raising devices moving the housing 120 between the first and second positions are not shown to simplify the description. When the housing 120 is in the first position, the housing 120 and the base 111 form the chamber 114 for low-pressure processing of the substrate 113. When the process is finished, the housing 120 is moved to the second position allowing a robot (not shown) to access the substrate 113.

Figure 2C:
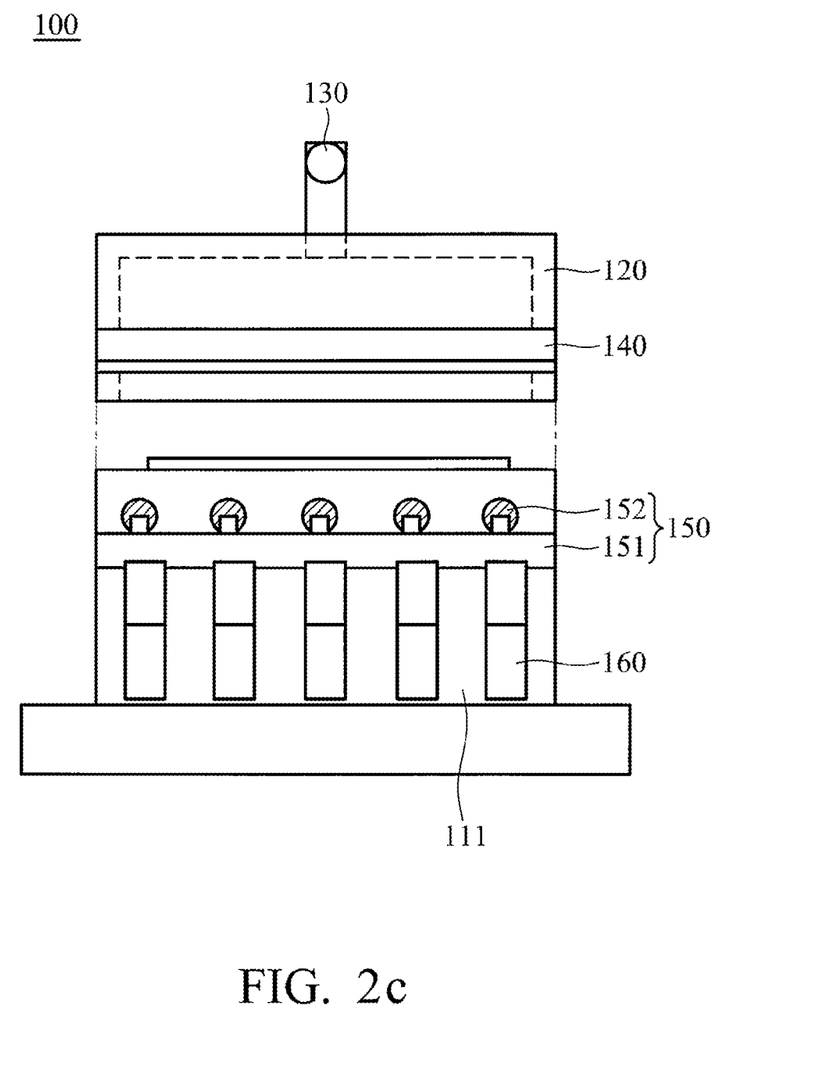
FIG. 2c is a side view of a low-pressure process apparatus of the invention when the housing is in the second position.

FIG. 2c is a side view of the low-pressure process apparatus 100 when the housing 120 is in the second position. Each first roller set 150 comprises a supporting element 151 and a plurality of rollers 152. The rollers 152 are disposed on the supporting element 151. The supporting element 151 contacts the actuating device 160.

Figure 3A:
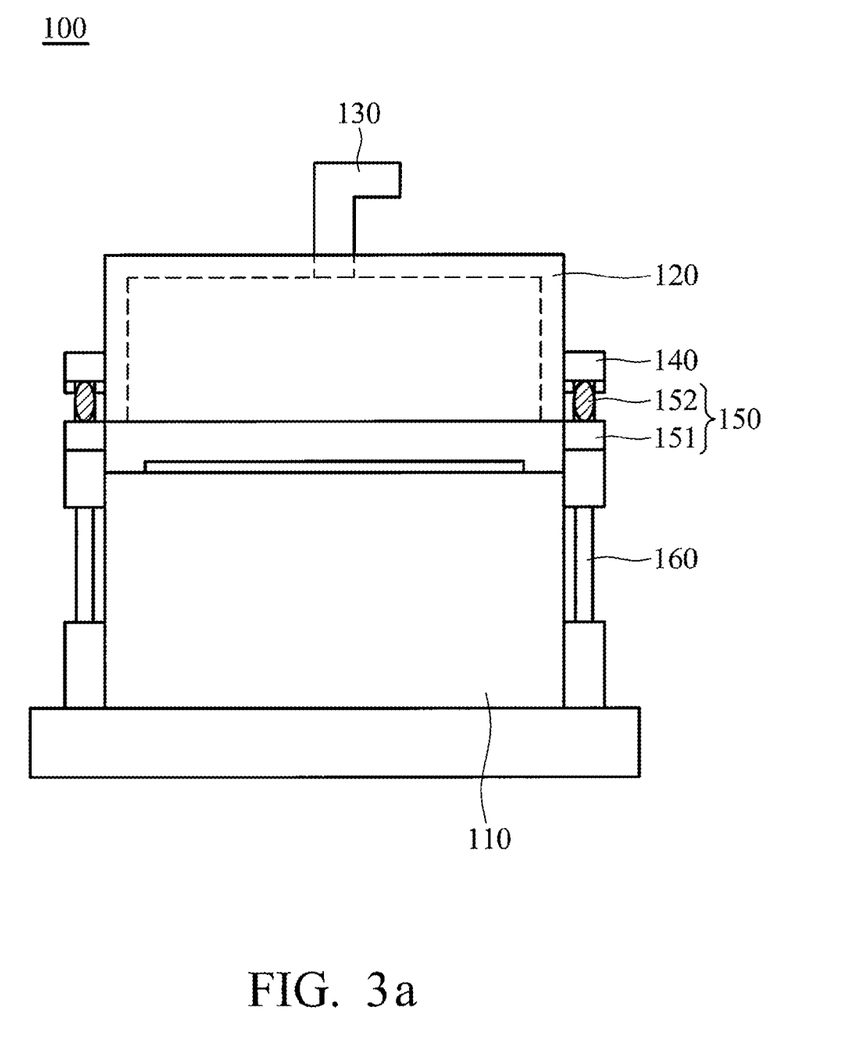
FIGS. 3a and 3b show first roller sets contacting lead grooves.
Figure 3B:
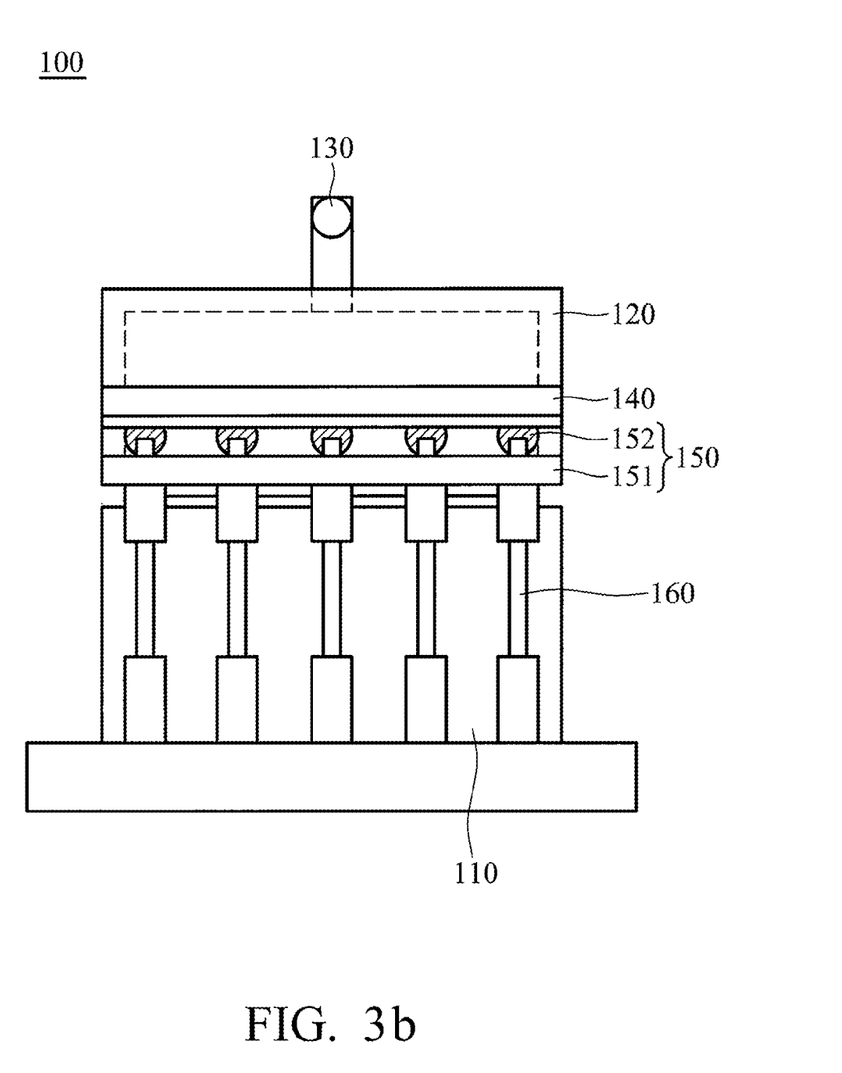
Figure 3C:
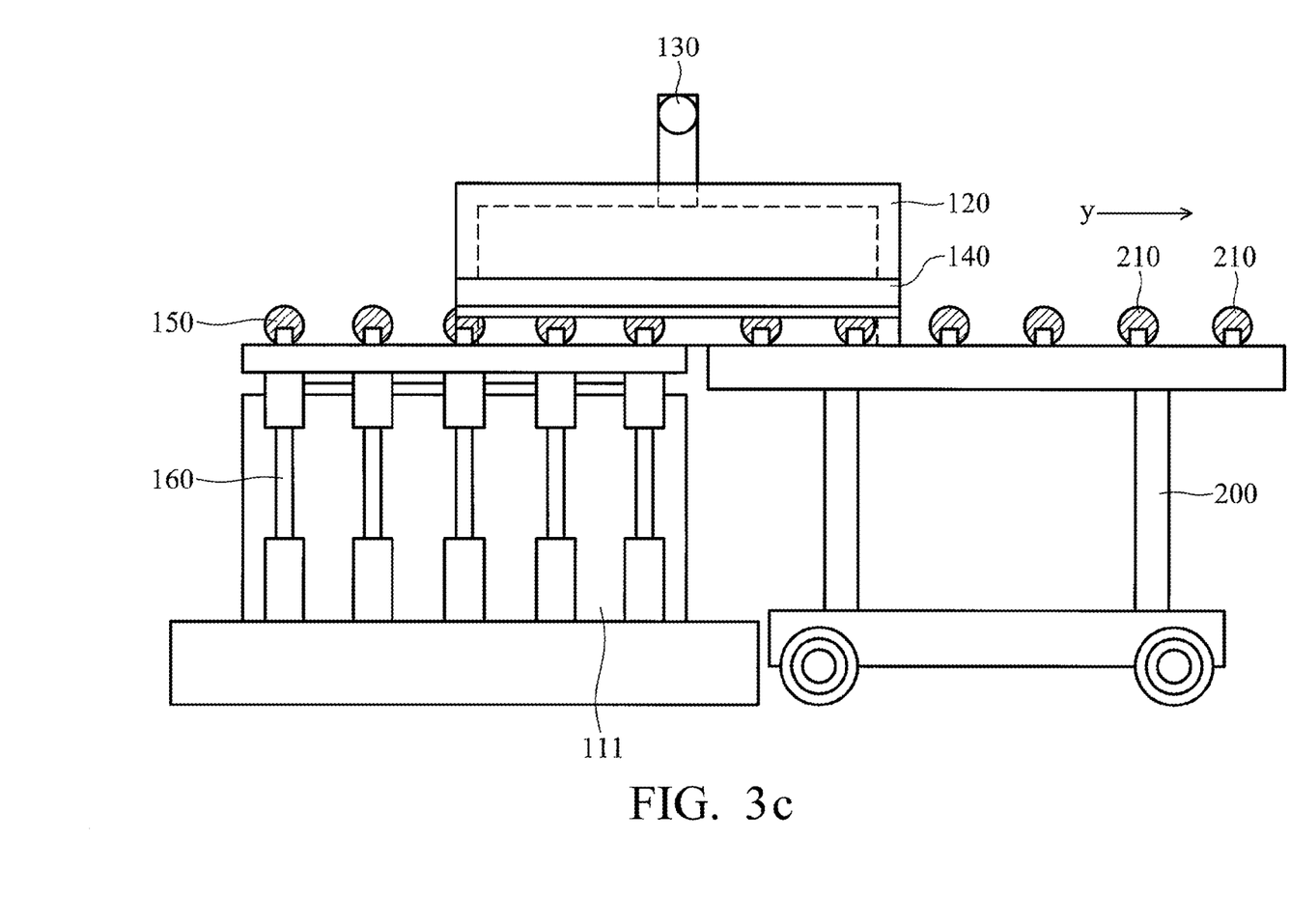
FIG. 3c shows the housing sliding by the first roller sets and the lead grooves.

With reference to FIGS. 3a and 3b, the housing 120 is detachably disposed on the base 110. The user can remove the housing 120 from the base 110 to clean the housing 120 individually. When the housing 120 is detached from the base 110, the actuating devices 160 raise the first roller sets 150 to a first plane to contact the lead grooves 140, wherein the first roller sets 150 support and move the housing 120. In a modified embodiment, the actuating devices 160 further raise the housing 120 and the first roller sets 150 after the first roller sets 150 contact the lead grooves 140. With reference to FIG. 3c, after the first roller sets 150 are raised to the first plane and contact the lead grooves 140, the housing 120 is moved to a transmission device 200 in a first horizontal direction y. The transmission device 200 comprises second roller sets 210 located on the first plane. The housing 120 is moved on the first roller sets 150 and the second roller sets 210 by the lead grooves 140.

Figure 4A:
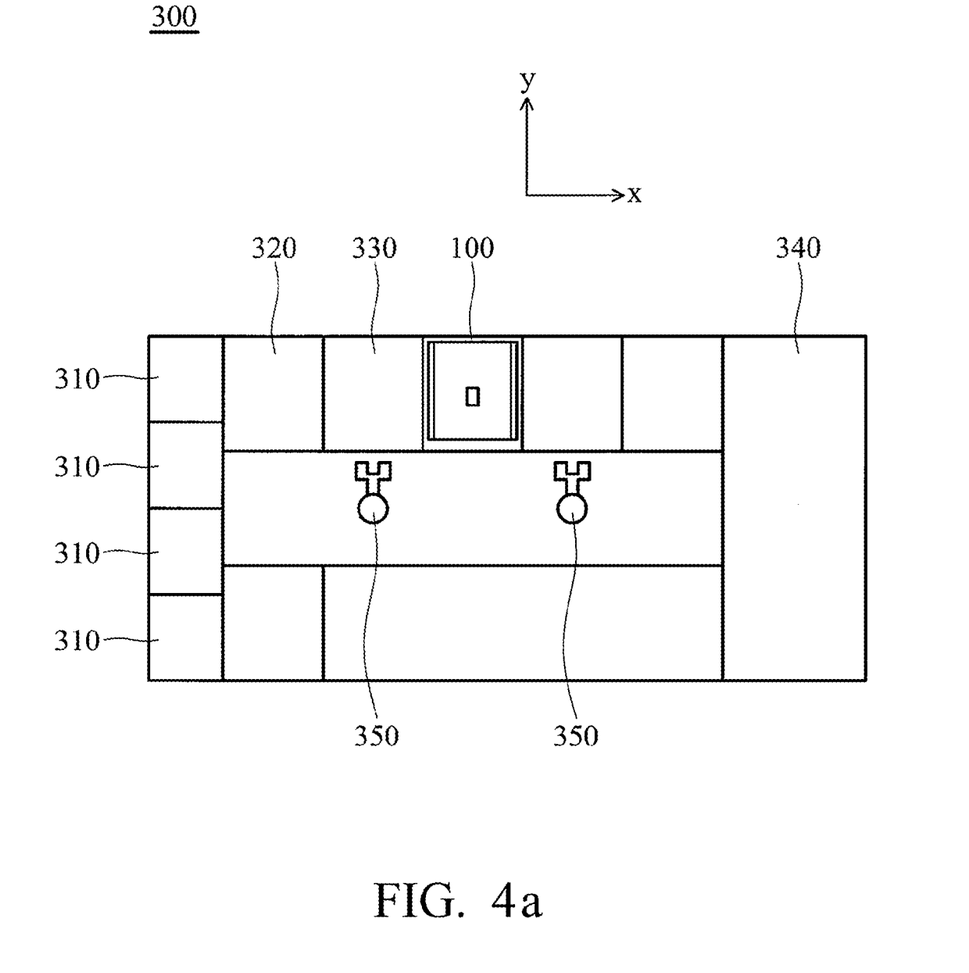
FIG. 4a shows substrate processing equipment of the invention.
Figure 4B:
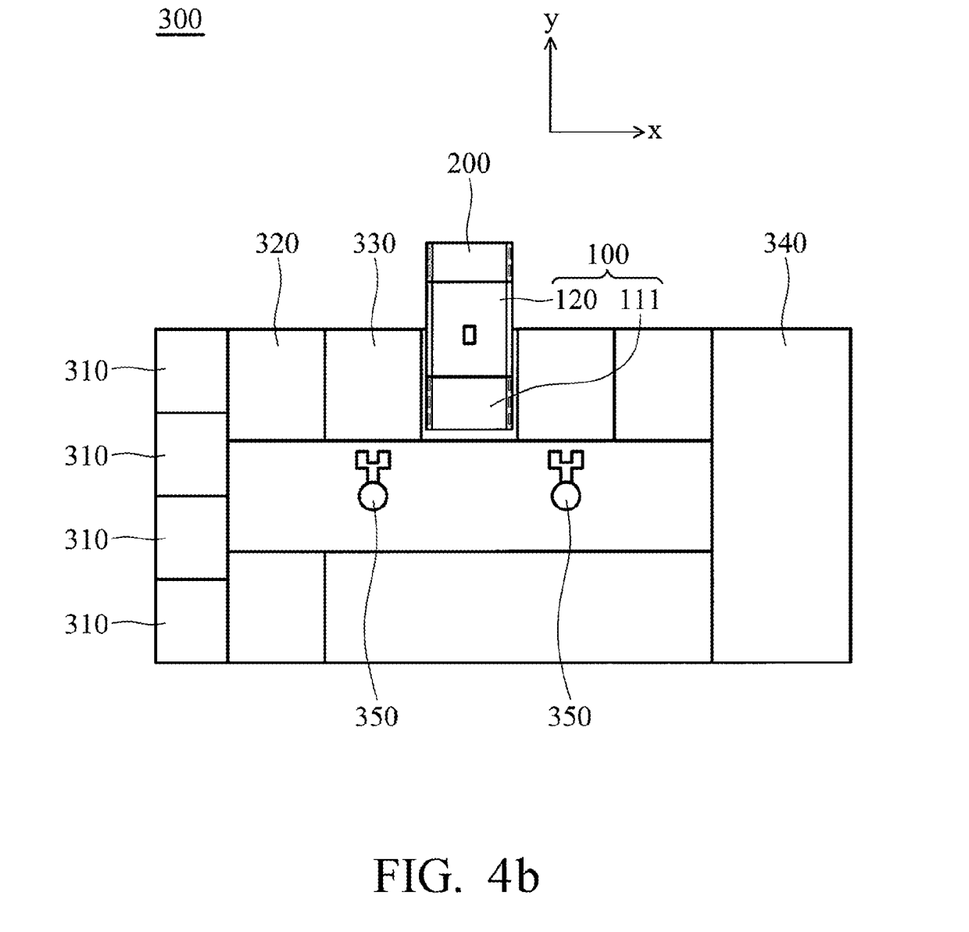
FIG. 4b shows the housing detached from the substrate processing equipment.

FIG. 4a shows the low-pressure process apparatus 100 of the invention disposed in substrate process equipment 300. The substrate process equipment 300 comprises a plurality of stockers 310, a cleaning unit (first process apparatus) 320, a photoresist coating apparatus (second process apparatus) 330, low-pressure process apparatus 100, an exposure unit 340 and robots 350, wherein the cleaning unit (first process apparatus) 320, the photoresist coating apparatus (second process apparatus) 330, and the low-pressure process apparatus 100 are arranged along a second horizontal direction x. With reference to FIG. 4b, when the housing 120 is detached, the housing 120 is moved to the transmission device 200 in the first horizontal direction y perpendicular to the second horizontal direction x.

The housing 120 of the invention is detached and removed from the base 111 to be cleaned. Thus, when the original housing (first housing) is cleaned, another housing (second housing) can be disposed on the base 111 to continue the low-pressure process. Shutdown time of the low-pressure process apparatus is thus shortened, and yield and cost are conserved.

The low-pressure process apparatus 100 of the invention can be utilized drying organic solvents, such as photoresist (for example, resin).

Figure 5:
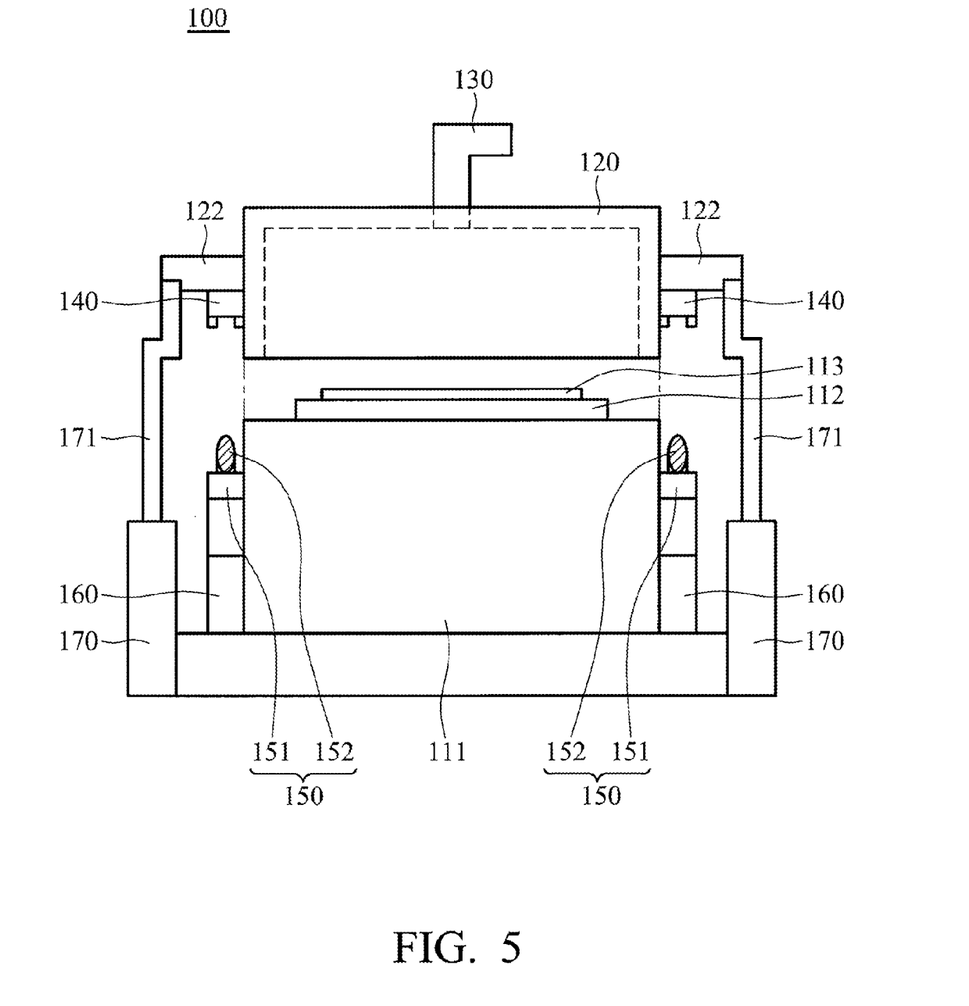
FIG. 5 shows raising devices of the invention.

With reference to FIG. 5, the housing 120 is moved between the first position and the second position by the raising devices 170 and the supporting structures 122. Each raising device 170 comprises a supporting rod 171. The supporting structures 122 are disposed on the housing 120. The supporting rods 171 are connected to the supporting structures 122. The raising devices 170 raise the housing 120 by the supporting rods 171. The supporting rods 171 abut the supporting structures 122 for easy detachment.

Figure 6A:
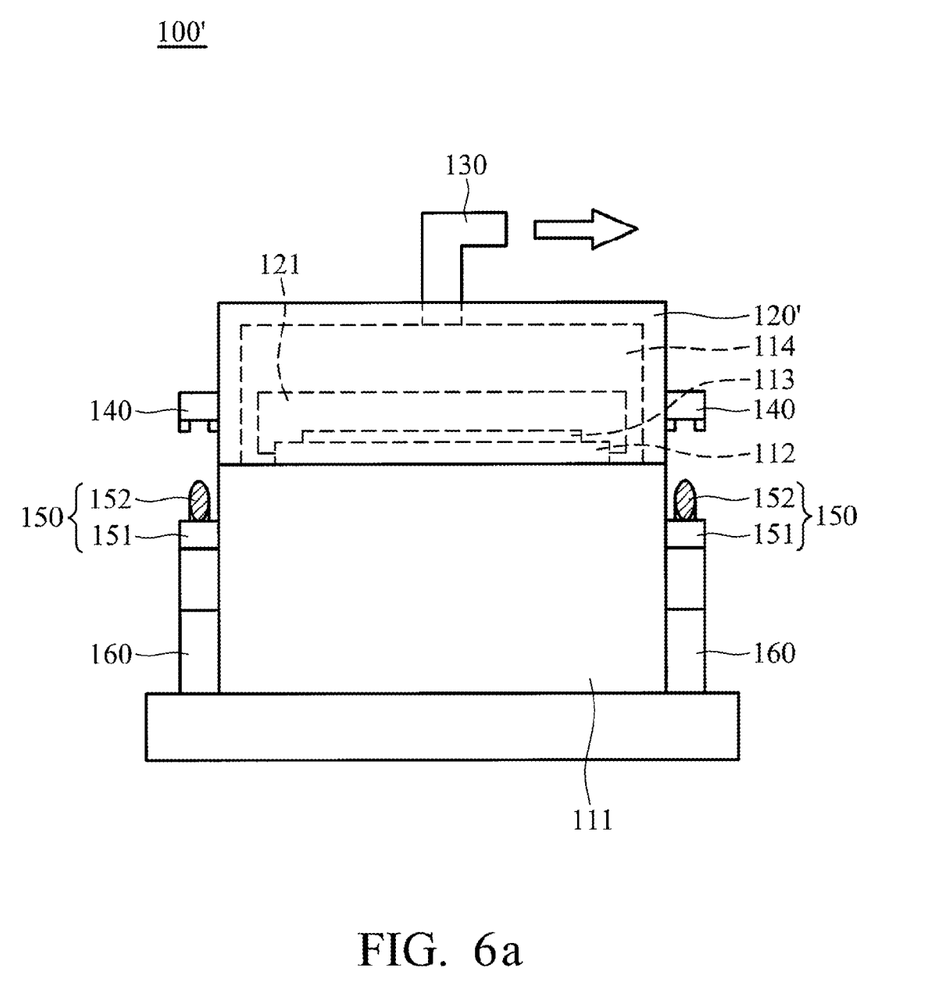
FIG. 6a shows a low-pressure process apparatus of a second embodiment of the invention.
Figure 6B:
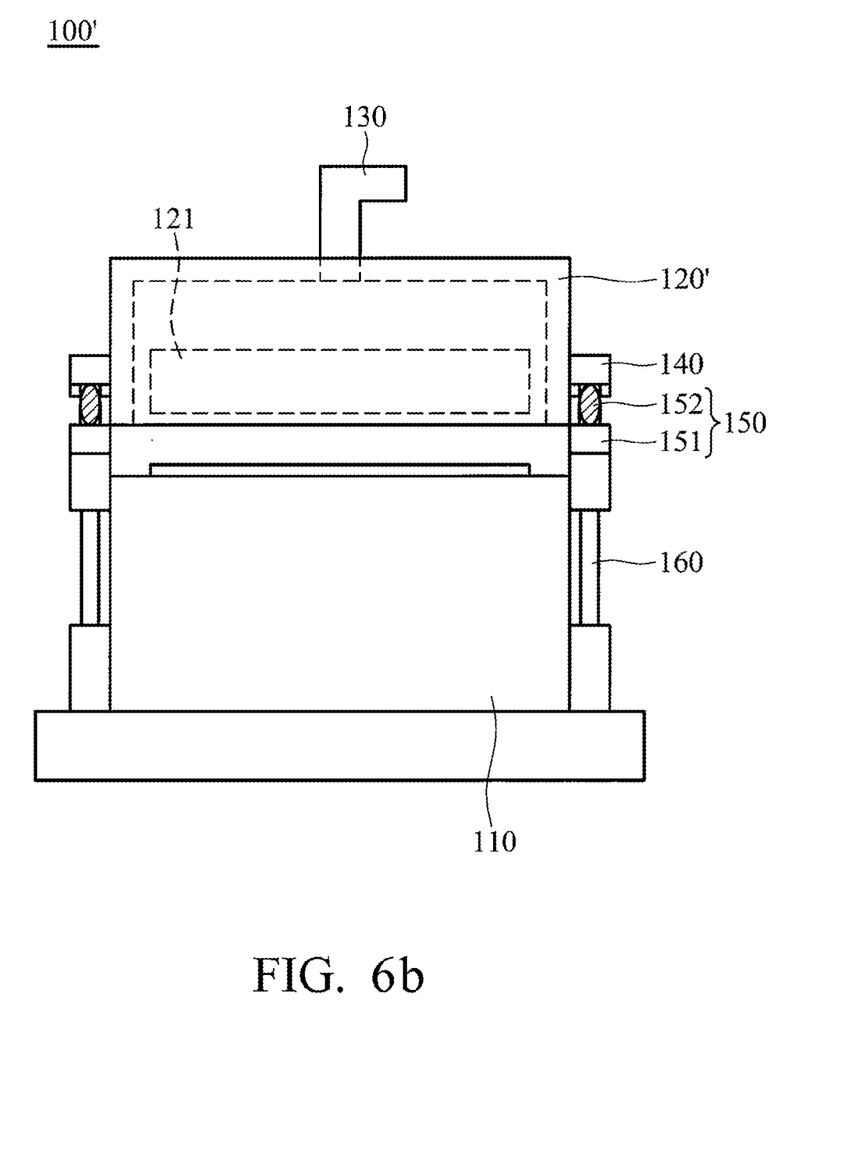
FIG. 6b shows a housing detached from the low-pressure process apparatus of the second embodiment.

FIG. 6a shows a low-pressure process apparatus 100' of a second embodiment of the invention, wherein the housing 120' comprises a gate 121 disposed on a back side thereof. Thus, in the second embodiment, when the robot accesses the substrate 113, the housing 120' is not raised. With reference to FIG. 6b, when the housing 120' is detached to be cleaned, the actuating devices 160 directly push the first roller sets 150 and the housing 120'. In the second embodiment of the invention, there is no additional device to raise the housing 120'.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A low-pressure process apparatus for processing a substrate, comprising:
    a base;
    a stage, disposed on the base supporting the substrate;
    a housing, detachably disposed on the base and moving between a first position and a second position, wherein when the housing is in a first position, the housing and the base form a chamber to receive the stage; and
    at least one first roller set, wherein when the housing is detached, the first roller set contacts and supports the housing to facilitate movement thereof in a first horizontal direction.

2. The low-pressure process apparatus as claimed in claim 1, wherein the housing comprises at least one lead groove disposed thereon corresponding to the first roller set.

3. The low-pressure process apparatus as claimed in claim 1, further comprising at least one actuating device disposed on the base connecting the first roller set, wherein when the housing is in the second position, the actuating device pushes the first roller set to a first plane to contact and support the housing.

4. The low-pressure process apparatus as claimed in claim 3, wherein the actuating device is an air cylinder.

5. A low-pressure process apparatus for processing a substrate, comprising:
    a base;
    a stage, disposed on the base supporting the substrate;
    a housing, detachably disposed on the base, wherein the housing and the base form a chamber to receive the stage, and the housing comprises a gate disposed thereon;
    at least one actuating device; and
    at least one first roller set connecting the actuating device, wherein when the housing is detached, the actuating device pushes the first roller set and the housing, and the housing contacts the first roller set to be moved in a first horizontal direction via the first roller set.

6. The low-pressure process apparatus as claimed in claim 5, wherein the housing comprises at least one lead groove disposed thereon corresponding to the first roller set.

7. The low-pressure process apparatus as claimed in claim 5, wherein the actuating device is an air cylinder.

* * * * *